(12) United States Patent
Kimura et al.

(10) Patent No.: US 7,919,359 B2
(45) Date of Patent: Apr. 5, 2011

(54) SEMICONDUCTOR MOUNTING SUBSTRATE AND METHOD FOR MANUFACTURING THE SAME

(75) Inventors: Junichi Kimura, Aichi (JP); Hideki Niimi, Gifu (JP); Yuji Fuwa, Gifu (JP); Tsuyoshi Sakaue, Hyogo (JP)

(73) Assignee: Panasonic Corporation, Osaka (JP)

( * ) Notice: Subject to any disclaimer, the term of this patent is extended or adjusted under 35 U.S.C. 154(b) by 288 days.

(21) Appl. No.: 11/873,618

(22) Filed: Oct. 17, 2007

(65) Prior Publication Data

US 2008/0093739 A1 Apr. 24, 2008

(30) Foreign Application Priority Data

Oct. 18, 2006 (JP) ................................. 2006-283356
Nov. 10, 2006 (JP) ................................. 2006-304734

(51) Int. Cl.
*H01L 23/52* (2006.01)

(52) U.S. Cl. ........ 438/118; 438/106; 438/108; 438/126; 438/128; 438/782; 257/E21.502; 257/E21.503; 228/248.1

(58) Field of Classification Search .................. 257/734, 257/657, 687, 690, 697, 698, 700, 730, 753, 257/774, 780, 781, 787, 788, E21.502, E21.503; 438/782, 106, 108, 126, 127; 228/248.1
See application file for complete search history.

(56) References Cited

U.S. PATENT DOCUMENTS

| | | | | |
|---|---|---|---|---|
| 6,153,930 | A * | 11/2000 | Hori .............................. | 257/687 |
| 6,649,446 | B1 | 11/2003 | Goetz et al. | |
| 2002/0109218 | A1* | 8/2002 | Akram ........................... | 257/697 |
| 2004/0150118 | A1* | 8/2004 | Honda .......................... | 257/778 |
| 2005/0142691 | A1 | 6/2005 | Shibata | |
| 2005/0206016 | A1* | 9/2005 | Shohji et al. ................... | 257/787 |
| 2005/0233122 | A1* | 10/2005 | Nishimura et al. ............. | 428/209 |
| 2007/0221711 | A1* | 9/2007 | Wada et al. ................... | 228/248.1 |
| 2008/0017969 | A1* | 1/2008 | Kimura et al. .................. | 257/687 |

FOREIGN PATENT DOCUMENTS

| | | |
|---|---|---|
| EP | 1 734 801 | 12/2006 |
| JP | 8-241900 | 9/1996 |
| JP | 11-214586 | 8/1999 |
| WO | 2006/041068 | 4/2006 |
| WO | WO 2006041068 | * 4/2006 |

OTHER PUBLICATIONS

Extended European Search Report issued Jun. 30, 2009 in European Application No. EP 07 11 8576, which is a foreign counterpart of the present application.

* cited by examiner

*Primary Examiner* — Davienne Monbleau
*Assistant Examiner* — Farid Khan
(74) *Attorney, Agent, or Firm* — Wenderoth, Lind & Ponack, L.L.P.

(57) ABSTRACT

A semiconductor mounting substrate according to the present invention comprises: a substrate; a semiconductor device, mounted on this substrate; solder bumps, which connect the semiconductor device and the substrate; a first resin, filled in a space between the semiconductor device and the substrate; and electronic components, mounted on a face side of the semiconductor device where the semiconductor device is mounted, wherein bond strength reinforcing resin section is provided at least between a side face in the vicinity of a corner part of the semiconductor device and a substrate surface of the substrate in a position corresponding to the corner part.

12 Claims, 13 Drawing Sheets

SEMICONDUCTOR MOUNTING SUBSTRATE AND METHOD FOR MANUFACTURING THE SAME

BACKGROUND OF THE INVENTION

1. Field of the Invention

The present invention relates to a semiconductor mounting substrate on which a semiconductor device is mounted via solder bumps, and a method for manufacturing the same.

2. Description of the Related Art

In the following, a conventional semiconductor mounting substrate is described with reference to drawings. FIG. 13 is a front view of a conventional semiconductor mounting substrate. FIG. 14 is an expanded front view of a mounting condition of a corner part of a semiconductor device on this semiconductor mounting substrate. Recently, in order to respond to the demand for reduction in size of devices, semiconductor mounting substrate 10 has appeared which is obtained by flip-chip mounting semiconductor device 2 face-down on substrate 1, as shown in FIG. 13. Such a mounting means has been applied especially to mobile devices, typified by cellular phones, for achieving both portability and high functionality.

In such semiconductor mounting substrate 10, semiconductor device 2 and electronic component 3 are mounted on substrate 1, as shown in FIGS. 13 and 14. Solder bumps 4 are formed on semiconductor device 2, and semiconductor device 2 is connected to substrate 1 via solder bumps 4. Resin 5 is filled between substrate 1 and semiconductor device 2.

Here, as shown in FIG. 14, resin film (so called rewiring layer) 2b is formed on a lower face side of silicon substrate 2a in semiconductor device 2. Wiring formed on this resin film 2b connects a circuit (not shown) formed on silicon substrate 2a and solder bumps 4, as shown in FIG. 13.

It is to be noted that as a prior art document information related to invention of such a semiconductor mounting substrate, for example, Unexamined Japanese Patent Publication No. H08-241900 is known.

Next, a method for manufacturing the conventional semiconductor mounting substrate is described with reference to drawings. FIG. 15 is a manufacturing flowchart for the conventional semiconductor mounting substrate, FIG. 16A is a plan view of a semiconductor mounting substrate in an injection process in the manufacturing flowchart, and FIG. 16B is a front view of the semiconductor mounting substrate in the same injection process. In the following, a method for manufacturing the conventional semiconductor mounting substrate is described in the order of processes shown in FIG. 15.

Application process S1 is a process of supplying substrate 1 with solder 4a and flux 4b. It is to be noted that cream solder is used as solder 4a. Mounting process S2 after application process S1 is a process of mounting chip components 3a and semiconductor device 2 on substrate 1. At this time, chip component 3a and semiconductor device 2 are mounted with a spacing of about 0.15 mm therebetween. It is to be noted that a semiconductor device provided with solder bumps (not shown) is applied to semiconductor device 2. Reflow process S3 after mounting process S2 is a process of melting solder 4a and the solder bumps so that chip components 3a and semiconductor device 2 are connected to substrate 1.

Injection process S4 after reflow process S3 is a process of injecting resin 5 into a gap between semiconductor device 2 and substrate 1. In hardening process S5 after this injection process S4, resin 5 is hardened, to complete semiconductor mounting substrate 10.

It is to be noted that as a prior art document related to invention of such a method for manufacturing the semiconductor mounting substrate, for example, Unexamined Japanese Patent Publication No. H11-214586 is known.

However, in the case of filling first resin 5 between substrate 1 and semiconductor device 2 in such a conventional semiconductor mounting substrate, as shown in FIGS. 13 and 14, interface 2e between silicon substrate 2a and resin film 2b is not covered by first resin 5 and comes into an exposed state on side face 2c of the corner part of semiconductor device 2. When interface 2e comes into the exposed state as thus described, connection strength between silicon substrate 2a and resin film 2b is decreased. Hence there is a problem in that, when semiconductor mounting substrate 10 is dropped, peeling is apt to occur in interface 2e portion between silicon substrate 2a and resin film 2b.

Next, a problem with the method for manufacturing the conventional semiconductor mounting substrate shown in FIGS. 15, 16A and 16B is described. FIG. 17A is a sectional view of chip component 3a mounted on the conventional semiconductor mounting substrate (not shown), and FIG. 17B is a sectional view of a soldered place of chip component 3a shown in FIG. 17A, seen from a line 17B-17B.

In such a method for manufacturing conventional semiconductor mounting substrate 10, when a distance between semiconductor device 2 and adjacent chip component 3a is small, adjacent electronic component 3a and solder 4a are covered by first resin 5 in injection of first resin 5 between substrate 1 and semiconductor device 2. Here, a space between chip component 3a and substrate 1 is narrower than a space between substrate 1 and semiconductor device 2. Thereby, first resin 5 is resistant to entering into the space between chip component 3a and substrate 1. Therefore, as shown in FIGS. 17A and 17B, chip component 3a and solder 4a are covered by first resin 5 in a state where unfilled void 7 is formed between chip component 3a and substrate 1.

Further, for example when such semiconductor mounting substrate 10 is reflow-soldered to a parent substrate (not shown), solder 4a melts by heating. Since solder 4a is covered by first resin 5 except in void 7 at this time, solder 4a begins flowing in directions of arrows 7a in void 7 due to cubical expansion in melting of the solder. Solder 4a then flows into a lower side of chip component 3a from both sides of void 7, to cause a short circuit. Therefore, there has been a problem with conventional semiconductor mounting substrate 10 in that the distance between chip component 3a and semiconductor device 2 cannot be made small, thereby preventing high-density mounting.

SUMMARY OF THE INVENTION

The present invention solves the above-mentioned problems, and provides a highly reliable semiconductor mounting substrate having large dropping strength and a method for manufacturing the same.

That is, a semiconductor mounting substrate of the present invention includes: a substrate; a semiconductor device, mounted on this substrate; solder bumps, which connect this semiconductor device and the substrate; a first resin, filled in a space between the semiconductor device and the substrate; and electronic components, mounted on a face side of the semiconductor device where the semiconductor device is mounted, wherein a bond strength reinforcing resin section is provided at least between a side face in the vicinity of a corner part of the semiconductor device and a surface of the substrate in a position corresponding to the corner part.

With such a configuration formed, the first resin also adheres to the side face in the vicinity of the corner part of the semiconductor device. The first resin then creeps up in the space between the semiconductor device and the electronic component due to its interfacial tension and capillary phenomenon, to form the bond strength reinforcing resin section. This thus produces an effect of being able to provide a semiconductor mounting substrate which has large dropping strength and is not susceptible to dropping and the like and on which the semiconductor device, the electronic components and the like are mounted.

Since the electronic components can be mounted with a general-purpose mounting machine, excellent productivity is obtained. Further, since the electronic component is capable of also serving as part of a circuit configured on the semiconductor mounting substrate, it is possible to eliminate the need to provide an extra component, so as to realize an inexpensive semiconductor mounting substrate.

Moreover, a method for manufacturing a semiconductor mounting substrate according to the present invention includes: a connection member supplying process of supplying a connection member onto connection lands provided on a substrate; a mounting process of mounting a semiconductor device and electronic components on the substrate; a reflow process of heating the semiconductor device and the electronic components on the substrate, to be connected and mounted onto the substrate; and a resin filling process of filling a first resin into a space between the semiconductor device and the substrate from a central part of a side face of the semiconductor device, and then hardening the resin, wherein in the resin filling process, after injection and filling of the first resin into the space, a bond strength reinforcing resin section is provided at least between a side face in the vicinity of a corner part of the semiconductor device and a surface of the substrate in a position corresponding to the corner part With such a configuration formed, the first resin also adheres to the side face in the vicinity of the corner part of the semiconductor device. The first resin then creeps up in the space between the semiconductor device and the electronic component due to interfacial tension and capillary phenomenon, to form the bond strength reinforcing resin section. This thus produces an effect of being able to provide a semiconductor mounting substrate which has large dropping strength and is not susceptible to dropping and the like and on which the semiconductor device, the electronic components and the like are mounted. Further, the semiconductor device, the electronic components and the like are mounted such that the first resin creeps up in the space between the semiconductor device and the electronic component, thereby also producing an effect of being able to mount these components with high density.

DETAILED DESCRIPTION OF THE PREFERRED EMBODIMENT

Below, an embodiment of the present invention is described with reference to drawings. In the following drawings, dimensions are expanded for facilitating understanding of configurations. Further, since the same element is provided with the same numeral, its description may be omitted.

First Embodiment

Figure 1:
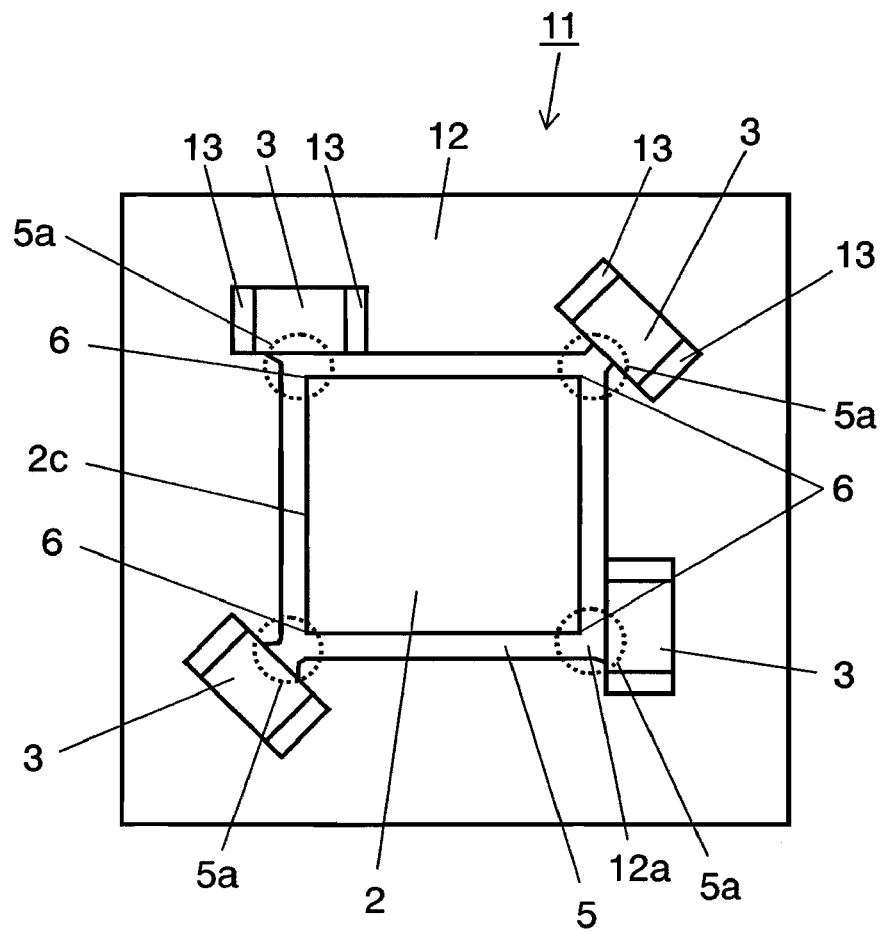
FIG. 1 shows a plan view of a semiconductor mounting substrate according to a first embodiment of the present invention.
Figure 2:
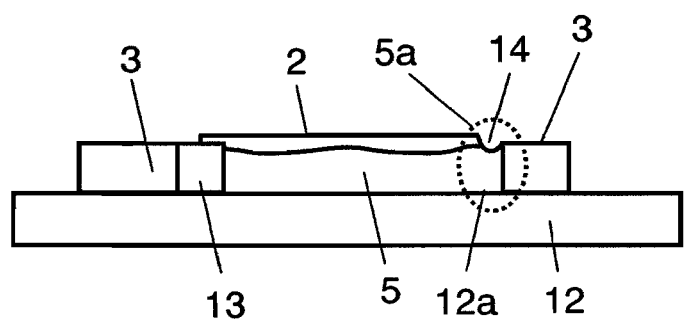
FIG. 2 shows a side view of the semiconductor mounting substrate according to the first embodiment of the present invention.
Figure 3:
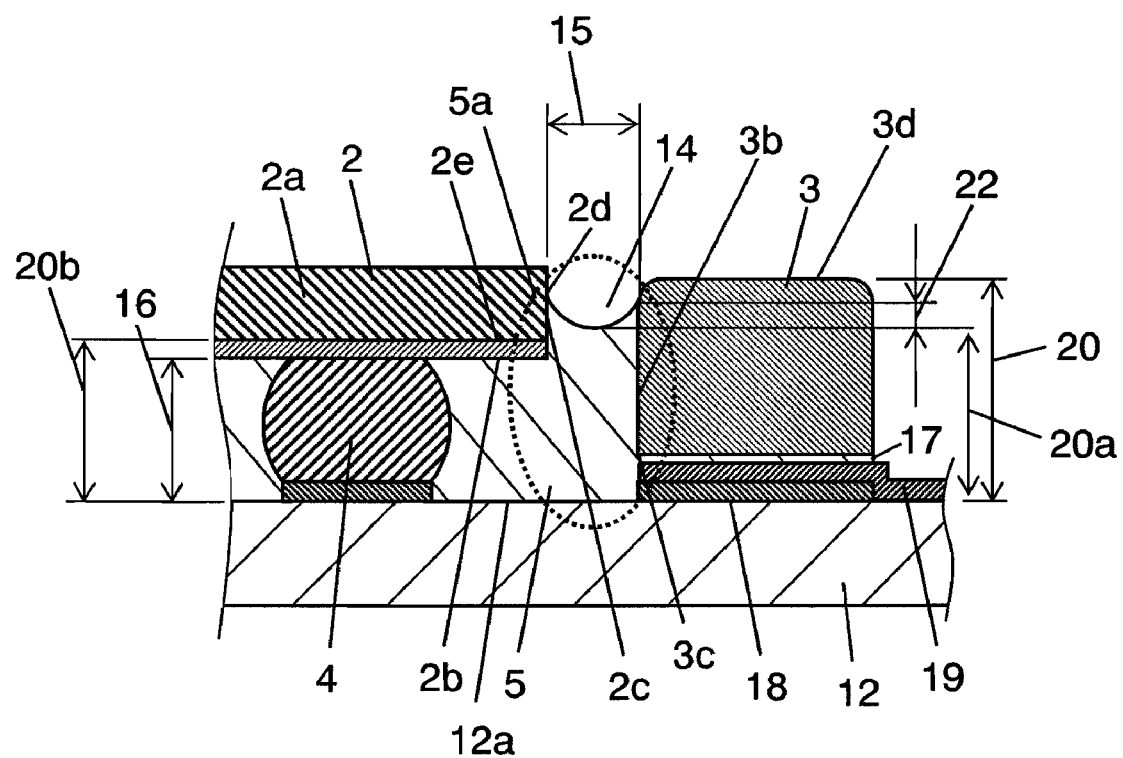
FIG. 3 shows an expanded sectional view of a main part of the semiconductor mounting substrate according to the first embodiment of the present invention.

Semiconductor mounting substrate 11 according to a first embodiment of the present invention is described below with reference to drawings. FIG. 1 is a plan view of semiconductor mounting substrate 11 according to the first embodiment of the present invention, FIG. 2 is a side view of the same, and FIG. 3 is an expanded sectional view of the same. It is to be noted that in FIGS. 1 to 3, the same elements as those in the conventional examples shown in FIGS. 13 to 17 are provided with the same numerals as those in the conventional examples so as to simplify descriptions of those elements.

In FIGS. 1 to 3, semiconductor device 2 and electronic components 3 are mounted on substrate 12. Semiconductor device 2 is connected to substrate 12 via solder bumps 4. Meanwhile, electronic component 3 is connected to substrate 12 via solder 13. Here, since the dimensions of solder bump 4 are on the order of 100 μm, connection strength between semiconductor device 2 and substrate 12 is small. In order to compensate such connection strength between semiconductor device 2 and substrate 12, a space between semiconductor device 2 and substrate 12 is filled with first resin 5.

First resin 5 is filled so as to reach corner part 6 of semiconductor device 2. At this time, first resin 5 reaches central part 2d of side face 2c of semiconductor device 2 earlier. Therefore, in central part 2d, first resin 5 flows out from the space between semiconductor device 2 and substrate 12 and creeps up along side face 2c, first resin 5 covers interface 2e between silicon substrate 2a and resin film 2b in the vicinity of central part 2d.

Meanwhile, first resin 5 having reached corner part 6 creeps up in space 14 formed between corner part 6 of semiconductor device 2 and insulating portion 3b of electronic component 3 due to the capillary phenomenon, to form and provide bond strength enforcing resin section 5a.

It is to be noted that bond strength enforcing resin section 5a is provided at least between side face 2c in the vicinity of corner part 6 of semiconductor device 2 and surface 12a of substrate 12 in a position corresponding to corner part 6. For forming space 14 where first resin 5 is made to creep up, electronic component 3 is arranged so as to come close to corner part 6 of semiconductor device 2. In addition, insulating portion 3b of electronic component 3 is mounted so as to be located correspondingly to corner part 6. Since this makes first resin 5 resistant to covering solder 13, solder 13 resists disturbing an operation when electronic component 3 is exchanged for repair or the like.

Here, for facilitating the first resin 5 to creep up in space 14 at corner part 6, gap 15 of space 14 is desirably made smaller than gap 16 from surface of substrate 12 to resin film 2b. In the present first embodiment, gap 16 is set to about 110 μm. This is aimed at completely filling first resin 5 to corner part 6, so as to prevent occurrence of a void or the like within first resin 5. Therefore, gap 15 of space 14 is set to 100 μm in the present first embodiment.

Further, typically, space 17 occurs between electronic component 3 and substrate 12. However, with space 17 present, first resin 5 flows into space 17 when creeping up, and it thus becomes hard for first resin 5 to creep up in space 14. In the present first embodiment, connection conductor 18 is formed in a place below insulating portion 3b of electronic component 3, and insulating film 19 is formed so as to cover an upper face of this conductor 18. Since this can make space 17 that is formed below insulating portion 3b of electronic component 3 small, first resin 5 becomes resistant to being absorbed into space 17, and becomes apt to creep up in space 14.

Moreover, electronic component 3 is desirably mounted with a sharp side corner 3c of insulating portion 3b turned downward. A condenser, a resistor, an inductor, and the like are typically cut into chip shape prior to burning. At this time, shear dropping occurs on a side where a cutting tooth enters, and corner 3c on the opposite side thereto is formed into cut shape. In the present first embodiment, this aspect is focused on, and in the case of mounting electronic component 3, mounting is performed so as to turn the sharp-side corner 3c downward. Thereby, space 17 between electronic component 3 and substrate 12 can be made smaller so that space first resin 5 becomes resistant to being absorbed into space 17 and becomes apt to creep up in space 14.

Here, it is of importance to use electronic component 3 which makes height 20 from substrate surface 12a of substrate 12 to upper face 3d of electronic component 3 larger than at least interface height 20b from substrate surface 12a of substrate 12 to interface 2e. This is because first resin 5 has to creep up to interface height 20b due to the capillary phenomenon between side face 2c of semiconductor device 2 and a side face of insulating portion 3b of electronic component 3.

It is to be noted that first resin 5 having crept up in space 14 is formed in concave shape with the center of space 14 recessed due to interfacial tension of first resin 5. Hence height 20a of the lowest point of the recess is desirably made not smaller than interface height 20b. Here, first resin 5 creeps up by creep-up dimensions 22 from a bottom of the recession due to the interfacial tension in insulating portion 3b. Therefore, in the present first embodiment, electronic component 3 is used which makes a difference between upper face 3d of electronic component 3 and interface height 20b not smaller than creep-up dimensions 22. Since this can make height 20a of the bottom of the recess larger than interface height 20b, interface 2e between silicon substrate 2a and resin film 2b is reliably covered by first resin 5. Therefore, even with impulsive force applied to semiconductor mounting substrate 11, it is possible to make cracking and the like hardly occur.

Figure 4:
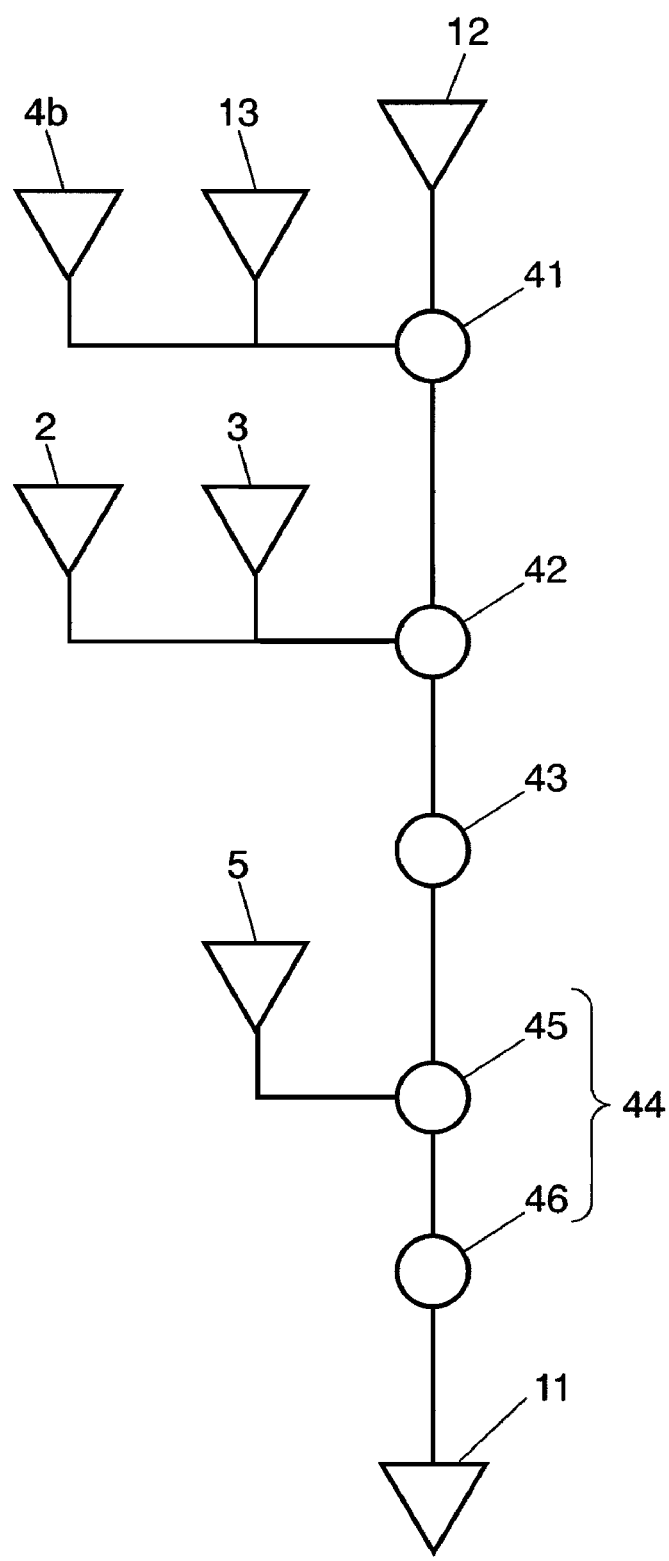
FIG. 4 shows a manufacturing flowchart for the semiconductor mounting substrate according to the first embodiment of the present invention.
Figure 5:
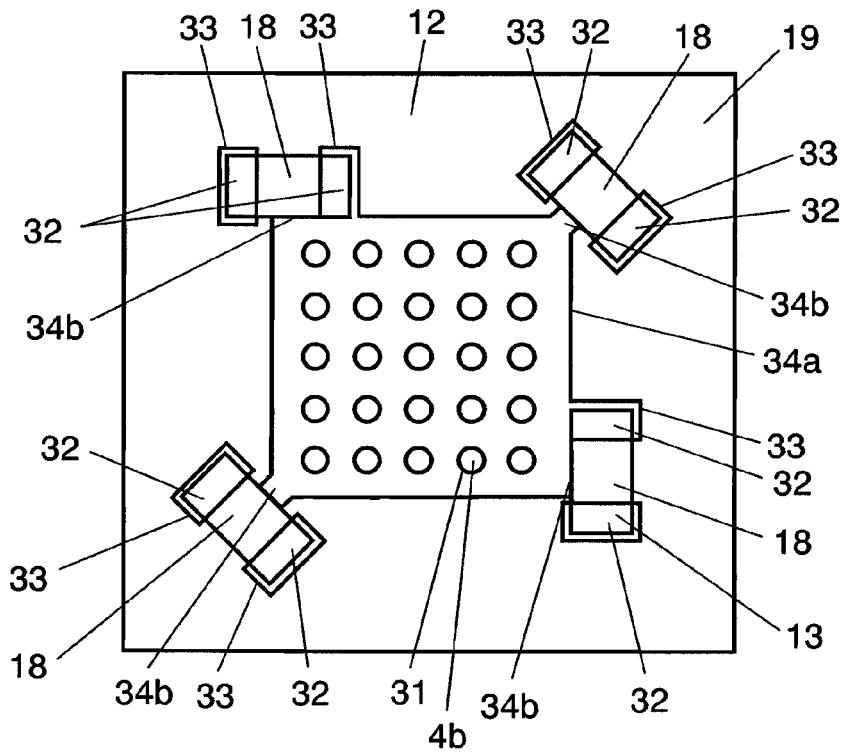
FIG. 5 shows a plan view of a substrate according to the first embodiment of the present invention.

In the following, a method for manufacturing semiconductor mounting substrate 11 in present first embodiment is described with reference to drawings. FIG. 4 is a manufacturing flowchart for semiconductor mounting substrate 11 in the present first embodiment, FIG. 5 is a plan view of substrate 12 in the same. It is to be noted that in FIGS. 4 and 5, the same elements as those in FIGS. 1 to 3 are provided with the same numerals so as to simplify descriptions of those elements.

In FIGS. 4 and 5, connection lands 31 on which semiconductor device 2 is mounted and connection lands 32 to which electronic components 3 are connected are formed on substrate 12. In addition, although insulating film 19 is formed on substrate 12, non-formation section 33 and non-formation section 34a of insulating film 19 are formed in respective positions corresponding to connection lands 31 and connection lands 32.

First, connection member supplying process 41 is a process of supplying a connection member onto substrate 12, flux 4b is applied onto connection lands 31 and solder 13 in paste form is applied onto connection lands 32.

Mounting process 42 is a process of mounting semiconductor device 2 and electronic components 3 on the respective connection lands 31 and 32 after connection member supplying process 41. It is to be noted that solder bumps 4 (not shown) are formed in positions corresponding to respective connection lands 31. In reflow process 43 after mounting process 42, solder bumps 4 and solder 13 are heated and melt so that semiconductor device 2 and electronic components 3 are connected and fixed to substrate 12.

Resin filling process 44 is a process of filling thermosetting first resin 5 into a space between semiconductor device 2 and substrate 12 and then hardening the resin, after reflow process 43. Resin filling process 44 is made up of injection process 45 in the first half and hardening process 46 in the last half. It is to be noted that an epoxy resin is used as first resin 5 in the present first embodiment.

First, in injection process 45, first resin 5 in liquid form is injected by a dispenser (not shown) or the like from central part 2d of side face 2c of semiconductor device 2 shown in FIG. 3. As shown in FIG. 2, first resin 5 injected at this time reaches earlier a central part of the opposite side to the side from which first resin 5 was injected. Therefore, first resin 5 overflows in the central part of the opposite side to the injection side, and creeps up along side face 2c of semiconductor device 2 in the central part on the opposite side to the injection side. Next, first resin 5 reaches the central part of side face 2c adjacent to the side from which first resin 5 was injected. First resin 5 then overflows from the central part of side face 2c adjacent to the injection side, and creeps up along side face 2c of semiconductor device 2. Finally, first resin 5 reaches corner part 6. This first resin 5 having reached this corner part 6 overflows in corner part 6, and creeps up in space 14 between semiconductor device 2 and electronic component 3 due to the capillary phenomenon.

In this manner, first resin 5 is hardened in hardening process 46 after injection of first resin 5. Thereby, first resin 5 creeps up in space 14 so that interface 2e can be covered by first resin 5. Bond strength enforcing resin section 5a is formed between side face 2c of semiconductor device 2 shown in FIG. 3 and substrate surface 12a of substrate 12 in the position corresponding to corner part 6, in the vicinity of corner part 6 of semiconductor device 2, shown in FIG. 1. Since bond strength enforcing resin section 5a is formed for reinforcement, resin film 2b of semiconductor device 2 is resistant to peeling off from interface 2e even in the case of dropping and the like. This can result in large dropping strength of semiconductor mounting substrate 11.

It is to be noted that, at this time, an overall circumference of interface 2e needs to be covered by first resin 5. In hardening process 46 in the present first embodiment, heating and hardening are performed with the surface of semiconductor device 2 turned downward, which is the surface side where resin film 2b is present out of the surfaces of semiconductor device 2. Thereby, first resin 5 with its viscosity once reduced due to heat of hardening process 46 falls downward and is hardened, leading to further creep-up of first resin 5, so that interface 2e is further tightly covered by first resin 5.

Additionally, in such a case, in injection process 45, it is previously arranged that at least first resin 5 having overflowed from the circumference of semiconductor device 2 adheres to side face 2c of semiconductor device 2. Further, in corner part 6 of semiconductor device 2, it is desirably previously arranged that first resin 5 creeps up in space 14 so as to come into contact with insulating portion 3b of electronic component 3. Thereby, first resin 5 becomes apt to flow along side face 2c of semiconductor device 2 and insulating portion 3b of electronic component 3 in hardening process 46.

It is to be noted that, in the present first embodiment, corner part 6 is arranged so as to correspond to insulating portion 3b of electronic component 3. This is because first resin 5 is apt to cover insulating portion 3b rather than solder 13, which prevents solder 13 from remelting and belching even in the case of reheating semiconductor mounting substrate 11.

Further, in the present first embodiment, connection conductor 18 is provided in a position lower than insulating portion 3b of electronic component 3. This can make space 17 small so as to make first resin 5 apt to creep up in space 14. Moreover, in the present first embodiment, connection conductor 18 is provided so as to mutually connect connection lands 32. This can make space 17 small with respect to a whole lower part of insulating portion 3b of electronic component 3.

Here, electronic component 3 may be mounted in a state either in parallel with or tilted against side face 2c of semiconductor device 2. For example, when electronic component 3 is mounted in parallel with side face 2c of semiconductor device 2, a creep-up range can be broadened due to the capillary phenomenon. When electronic component 3 is mounted as being tilted against corner part 6 of semiconductor device 2, it is possible to make first resin 5 apt to creep up against two adjacent faces forming corner part 6.

It is to be noted that mounting is preferably performed so as to locate corner part 6 correspondingly to almost the central part of the side face of electronic component 3. This is because, even in a case where electronic component 3 or semiconductor device 2 is mounted in a position displaced from its original mounting position, insulating portion 3b can be reliably arranged in the vicinity of corner part 6.

Moreover, in the present first embodiment, non-formation section 34a of insulating film 19 with respect to semiconductor device 2 is made larger than a periphery of semiconductor device 2. This can make gap 16 between semiconductor device 2 and substrate 12 large, thereby making first resin 5 to apt to flow. Thereby, a void or the like hardly occurs between semiconductor device 2 and substrate 12.

Furthermore, non-formation section 34a is provided with non-formation section 34b of insulating film 19, formed in a direction from the corner toward electronic component 3. This can make first resin 5 having reached corner part 6 apt to flow along non-formation section 34b in the direction toward electronic component 3

Second Embodiment

Figure 6:
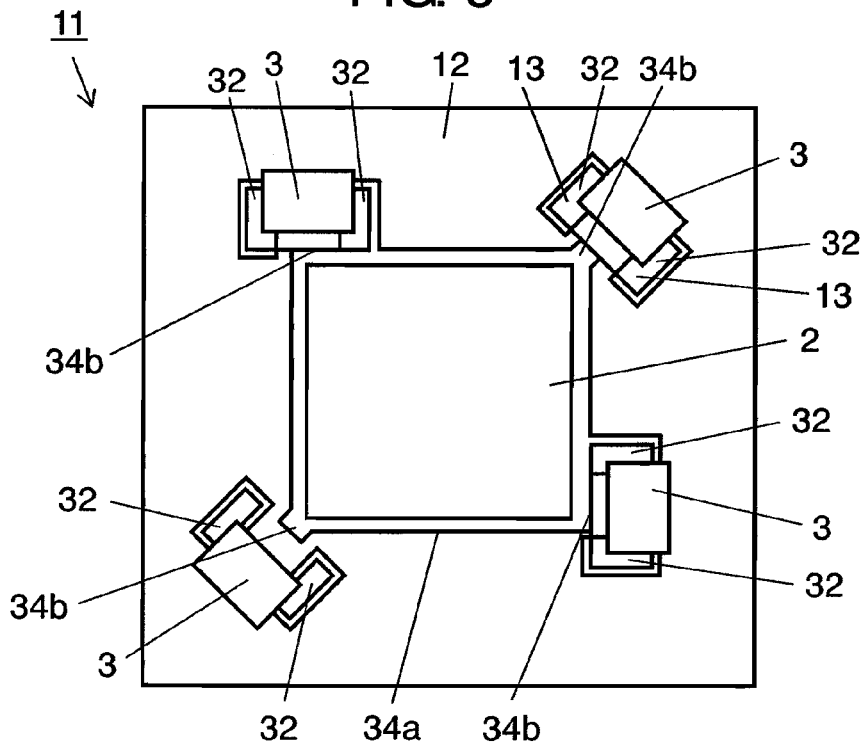
FIG. 6 shows a plan view of a semiconductor mounting substrate in a mounting process according to a second embodiment of the present invention.
Figure 16A:
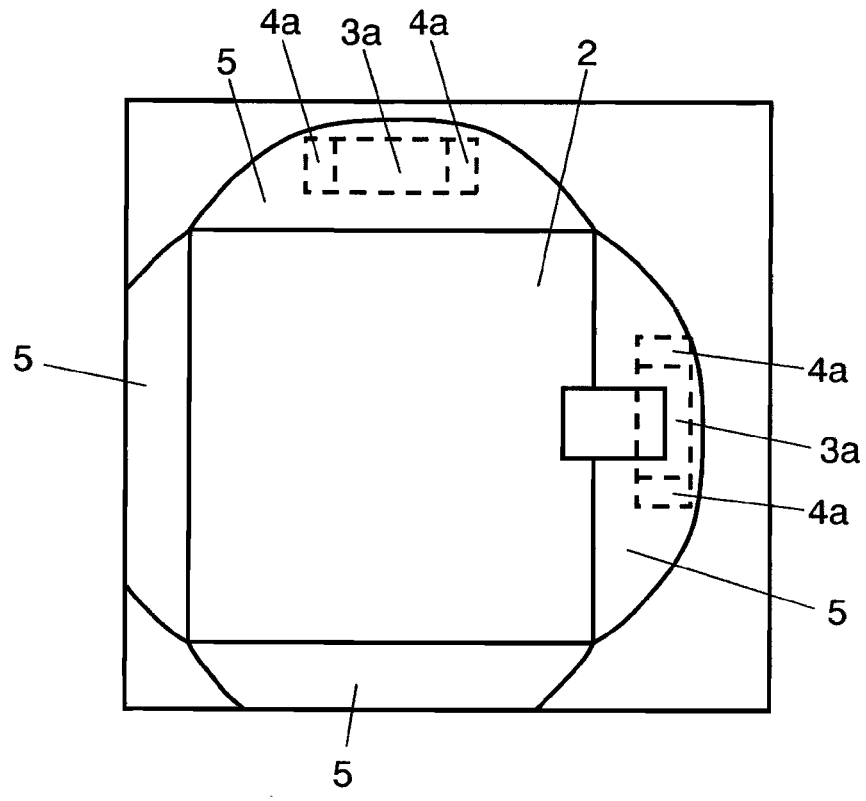
FIG. 16A shows a plan view of the semiconductor mounting substrate in an injection process shown in FIG. 15.
Figure 16B:
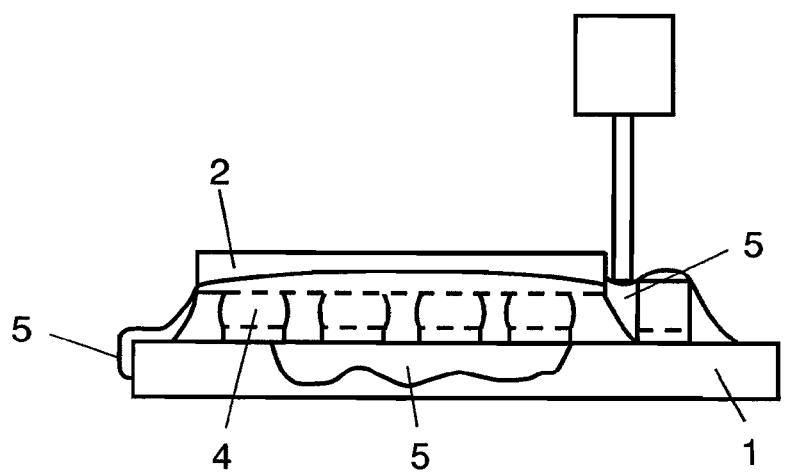
FIG. 16B shows a front view of the semiconductor mounting substrate in the injection process shown in FIG. 15.
Figure 17A:
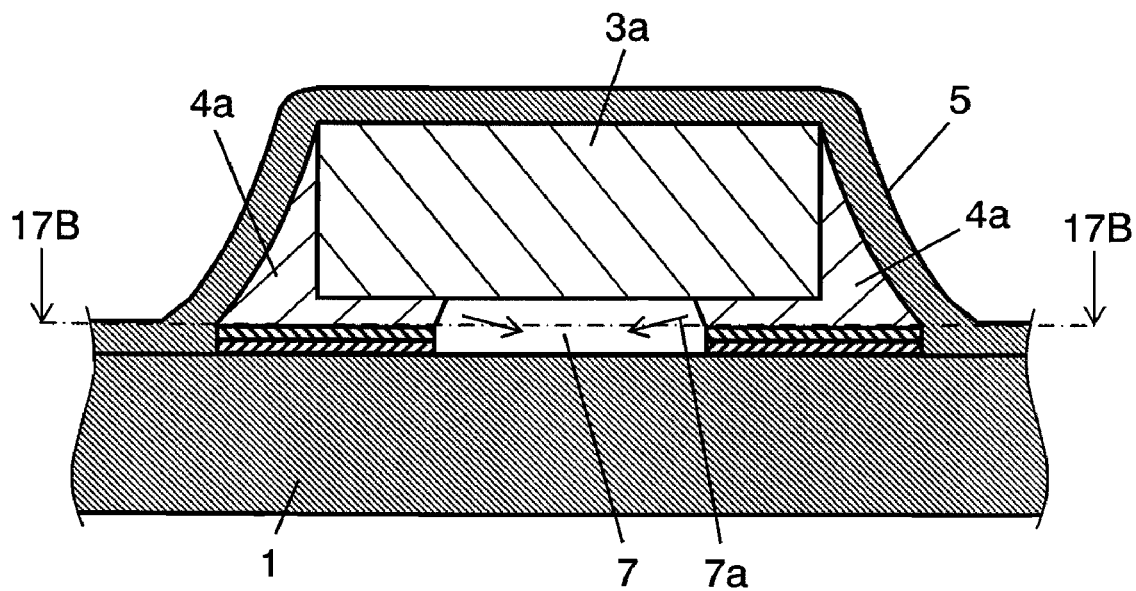
FIG. 17A shows a sectional view of a chip component mounted on the conventional semiconductor mounting substrate.
Figure 17B:
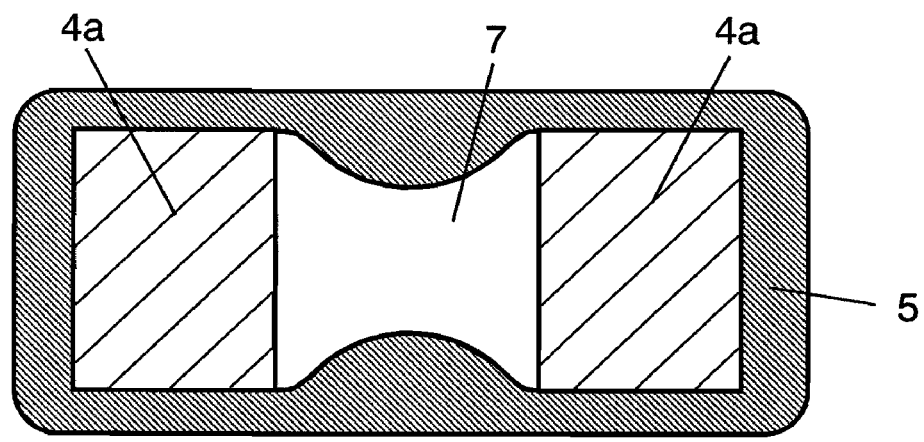
FIG. 17B shows a sectional view seen from a line 17B-17B of FIG. 17A.

In the following, a second embodiment of the present invention is described with reference to drawings. FIG. 16 is a plan view of semiconductor mounting substrate 11 in mounting process in the second embodiment of the present invention. In FIG. 6, the same elements as those in FIGS. 1 to 3 are provided with the same numerals so as to simplify descriptions of those elements.

In mounting process 42 in the present second embodiment shown in FIG. 6, semiconductor device 2 and electronic components 3 are mounted on substrate 12 in the same manner as in the first embodiment. However, electronic component 3 is mounted in a position displaced from positions of connection lands 32 in a direction away from semiconductor device 2. It is necessary to locate solder 13 and electronic component 3 so as to be into contact with each other.

In reflow process 43, by melting of solder 13, electronic component 3 moves to prescribed positions of connection lands 32. Here used is an action of solder 13 moving electronic component 3 to a prescribed position after occurrence of surface tension of solder 13 due to melting thereof, namely a self-alignment phenomenon.

In this manner, electronic component 3 can be brought close to corner part 6 of semiconductor device 2. Hence space 14 can be made small so that first resin 5 can be reliably creeping up in space 14. This results in formation of bond strength enforcing resin section 5a in a position of space 14.

Further, with the above-mentioned self-alignment used, space 14 between semiconductor device 2 and electronic component 3 can be made smaller than gap 15 with which mounting can be performed with a mounting machine. This is useful in size reduction of semiconductor mounting substrate 11 or gap 15 is made small for thickness reduction.

Third Embodiment

Figure 7A:
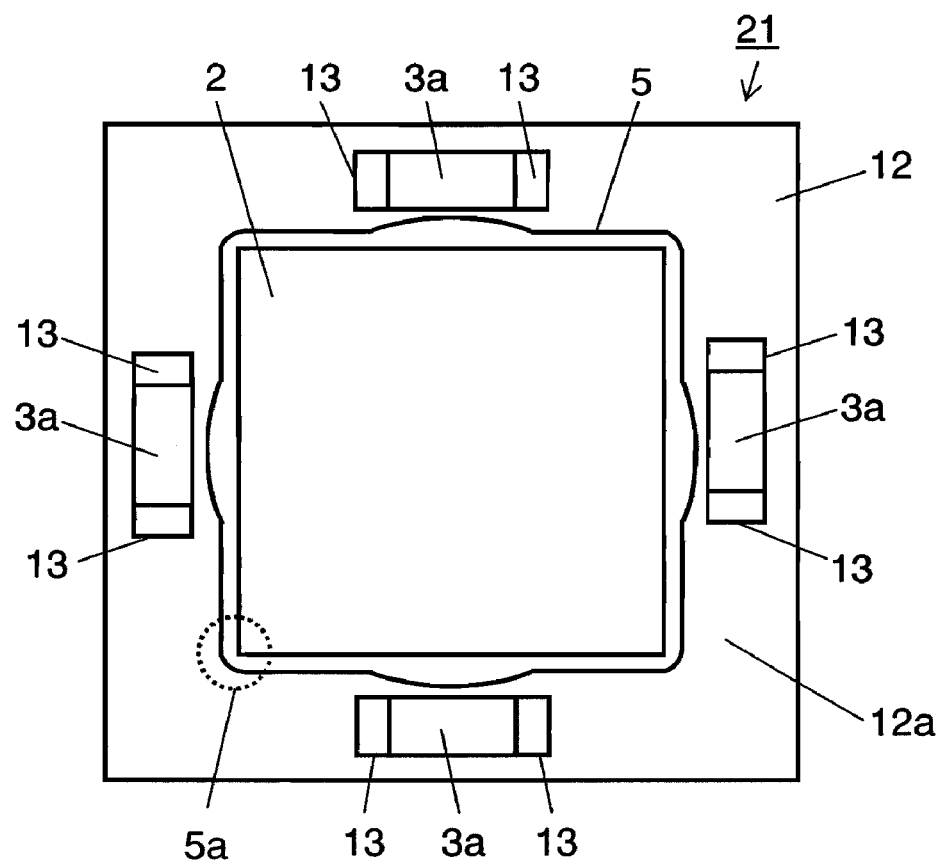
FIG. 7A shows a plan view of a semiconductor mounting substrate according to a third embodiment of the present invention.
Figure 7B:
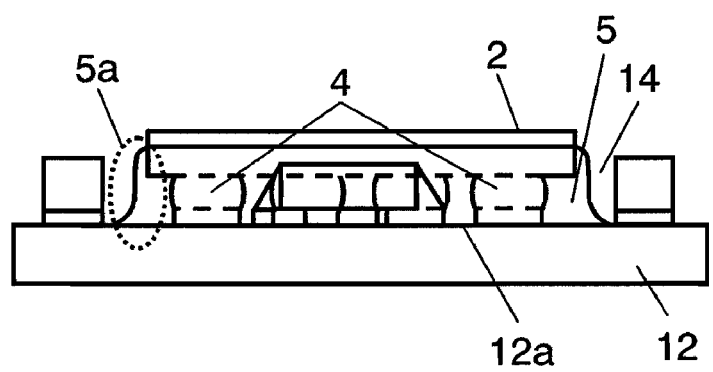
FIG. 7B shows a front view of the semiconductor mounting substrate according to the third embodiment of the present invention.

A third embodiment of the present invention is described with reference to drawings. FIG. 7A is a plan view of semiconductor mounting substrate 21 in the third embodiment of the present invention, and FIG. 7B is a front view of semiconductor mounting substrate 21 in the same. In FIGS. 7A and 7B, semiconductor mounting substrate 21 is obtained by mounting chip components 3a and semiconductor device 2 on substrate surface 12a side of substrate 12. Here, chip components 3a are connected and fixed to substrate 12 via solder 13, and semiconductor device 2 is flip-chip mounted on substrate 12 via solder bumps 4. Thermosetting first resin 5 intervenes between semiconductor device 2 and substrate 12. With bond strength enforcing resin section 5a formed by this first resin 5, connection strength between semiconductor device 2 and substrate 12 is maintained.

Figure 8:
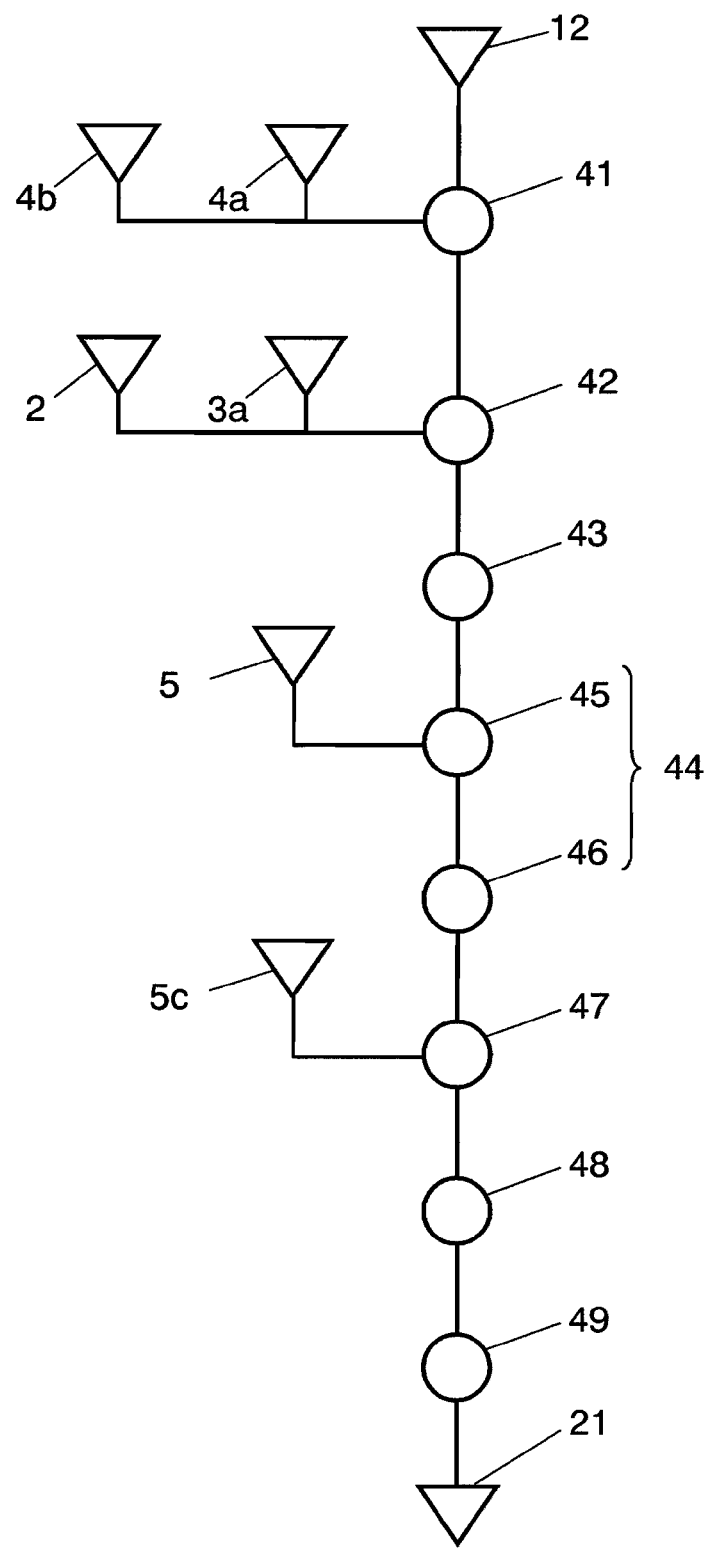
FIG. 8 shows a manufacturing flowchart for the semiconductor mounting substrate according to the third embodiment of the present invention.

FIG. 8 is a manufacturing flowchart for semiconductor mounting substrate 21 in the present third embodiment. It is to be noted that in FIG. 8, the same elements as those in FIG. 4 are provided with the same numerals so as to simplify descriptions of those elements. In the following, a production process for semiconductor mounting substrate 21 in the present third embodiment is described in accordance with the order of processes shown in this FIG. 8.

As shown in FIG. 8, connection member supplying process 41 is a process of supplying substrate 12 with solder 4a and flux 4b. It is to be noted that cream solder is used as solder 4a. This cream solder is printed by screen printing in positions where chip components 3a are mounted. Further, flux 4b is applied by transfer printing or the like in a position where semiconductor device 2 is mounted.

Next, mounting process 42 is a process of mounting chip components 3a and semiconductor device 2 on substrate 12 after connection member supplying process 41. Chip component 3a and semiconductor device 2 are mounted with a spacing of about 0.15 mm. It is to be noted that solder bumps 4 are provided on the lower face side of semiconductor device 2.

Figure 9A:
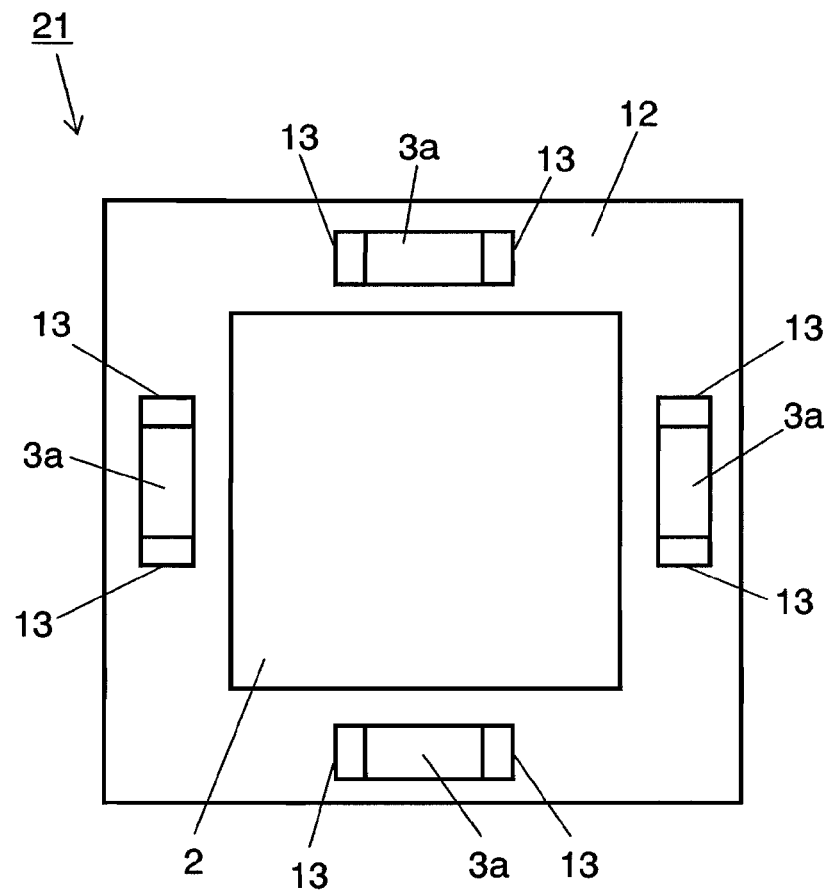
FIG. 9A shows a plan view of the semiconductor mounting substrate in a reflow process shown in FIG. 8.
Figure 9B:
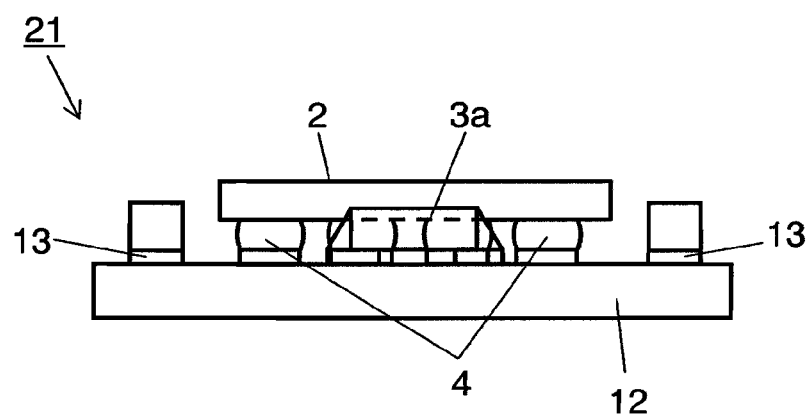
FIG. 9B shows a front view of the semiconductor mounting substrate in the reflow process shown in FIG. 8.

FIG. 9A is a plan view of semiconductor mounting substrate 21 in reflow process 43 shown in FIG. 8. FIG. 9B is a front view of semiconductor mounting substrate 21 in reflow process 43. In this reflow process 43, solder 13 and solder bumps 4 are melted so that chip component 3a and semiconductor device 2 are electrically and mechanically connected to substrate 12, as shown in FIGS. 9A and 9B.

Here, semiconductor device 2 includes a silicon substrate (not shown) and a rewiring layer (not shown) provided on this silicon substrate, a pad terminal (not shown) is formed on this rewiring layer, and solder bumps 4 are connected to this pad terminal. It is to be noted that a polyimide resin is used for the insulating film in the rewiring layer in the present third embodiment.

Figure 10A:
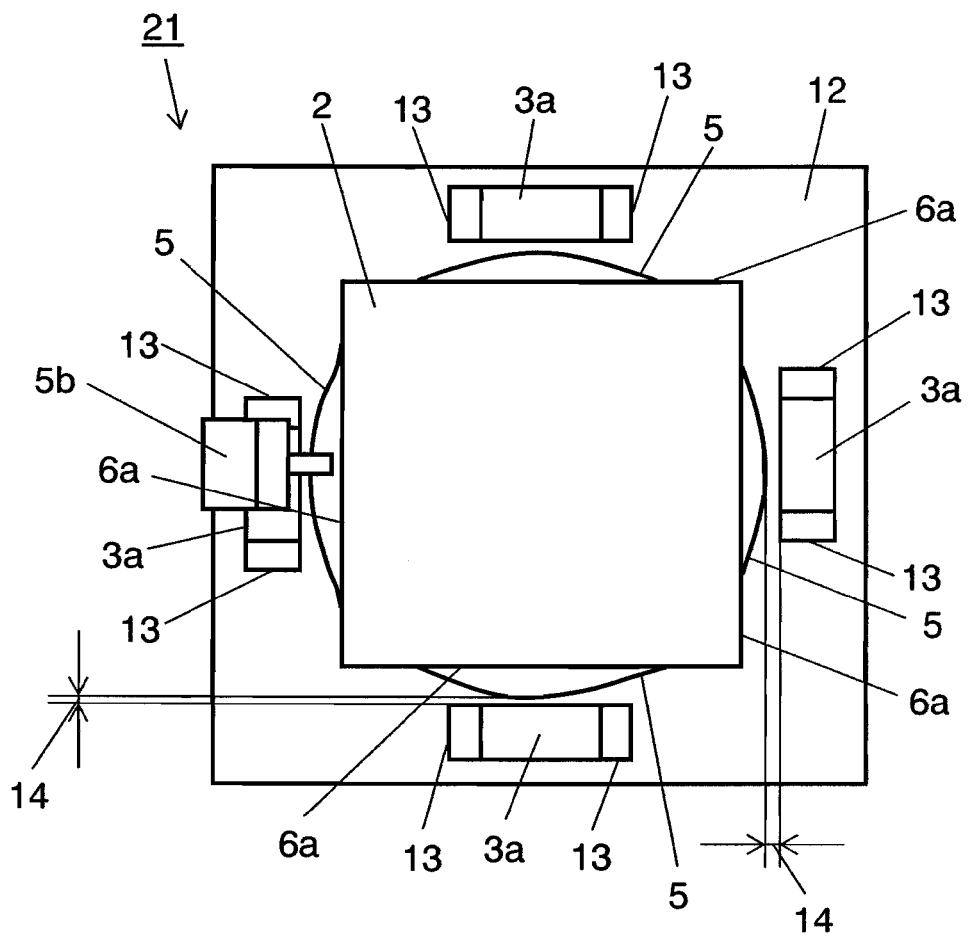
FIG. 10A shows a plan view of the semiconductor mounting substrate in an injection process shown in FIG. 8.
Figure 10B:
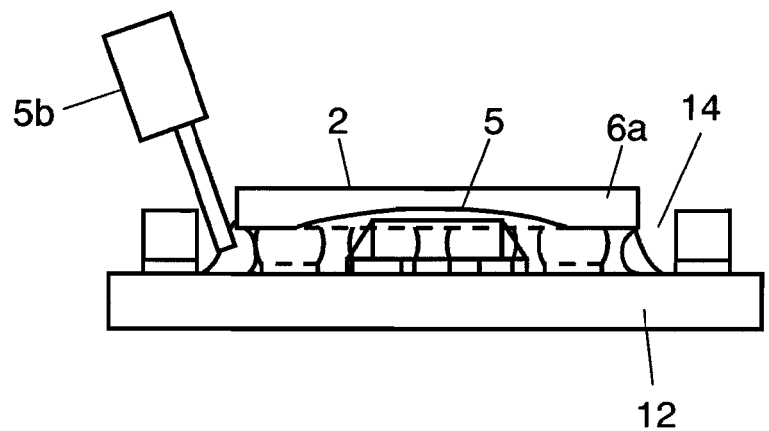
FIG. 10B shows a front view of the semiconductor mounting substrate in the injection process shown in FIG. 8.

FIG. 10A is a plan view of semiconductor mounting substrate 21 in injection process 45 as a first-half process of resin filling process 44 in the present third embodiment. FIG. 10B is a front view of semiconductor mounting substrate 21 in injection process 45 in the same. As shown in FIG. 8, injection process 45 is a process of injecting first resin 5 into the space between semiconductor device 2 and substrate 12. In this injection process 45, first resin 5 is injected by dispenser 5b from the vicinity of the center of one side face 6a of semiconductor device 2, as shown in FIGS. 10A and 10B. However, first resin 5 is injected so as not to come into contact with chip component 3a and solder 13 which are adjacent to semiconductor device 2 in injection process 45. That is, first resin 5 is injected so has to hold a space with chip component 3a and solder 13.

In this manner, it is possible to make solder 13 resistant to flowing into the space between chip component 3a and substrate 12 in the case of soldering semiconductor mounting substrate 21 to a parent substrate (not shown). It is thus possible to make a short circuit due to solder 13 below chip component 3a hardly occur.

Further, in the same manner as in the first embodiment shown in FIG. 3, also in injection process 45 in the present third embodiment, first resin 5 adheres not only to the space between substrate 12 and semiconductor device 2 but to one side face 6a of semiconductor device 2. It is of importance at this time that first resin 5 is bonded to a height not smaller than a height of an interface between the silicon substrate and the rewiring layer in semiconductor device 2 in a peripheral side face part of semiconductor device 2 in the same state as that shown in FIG. 3. In such a manner, the interface between the silicon substrate and the rewiring layer in semiconductor device 2 is covered and protected by first resin 5 due to dropping impact, thermal impact or the like. Consequently, cracking hardly occurs on this interface.

Here, a thermosetting resin is used as first resin 5. In hardening process 46 after injection process 45, first resin 5 is heated and then hardened. In the third present embodiment, in hardening process 46, heating is performed with the substrate surface 12a where semiconductor device 2 is turned upward. Here, in hardening process 46, hardening is performed at a temperature lower than melting points of solder 13 and solder bumps 4. It is to be noted that, although heating was performed with substrate surface 12a where semiconductor device 2 is mounted turned upward in hardening process 46 in the present third embodiment, heating may be performed with substrate surface 12a turned downward.

In this manner, the first resin having become more mobile by heating becomes apt to move downward under the influence of gravity, so that first resin 5 becomes apt to be bonded to a height not smaller than the height of the interface between the silicon substrate and the rewiring layer in semiconductor device 2. Therefore, semiconductor device 2 becomes further less susceptible to dropping impact, thermal impact and the like, and thereby cracking hardly occurs on the interface between the silicon substrate and the rewiring layer in semiconductor device 2.

Figure 11A:
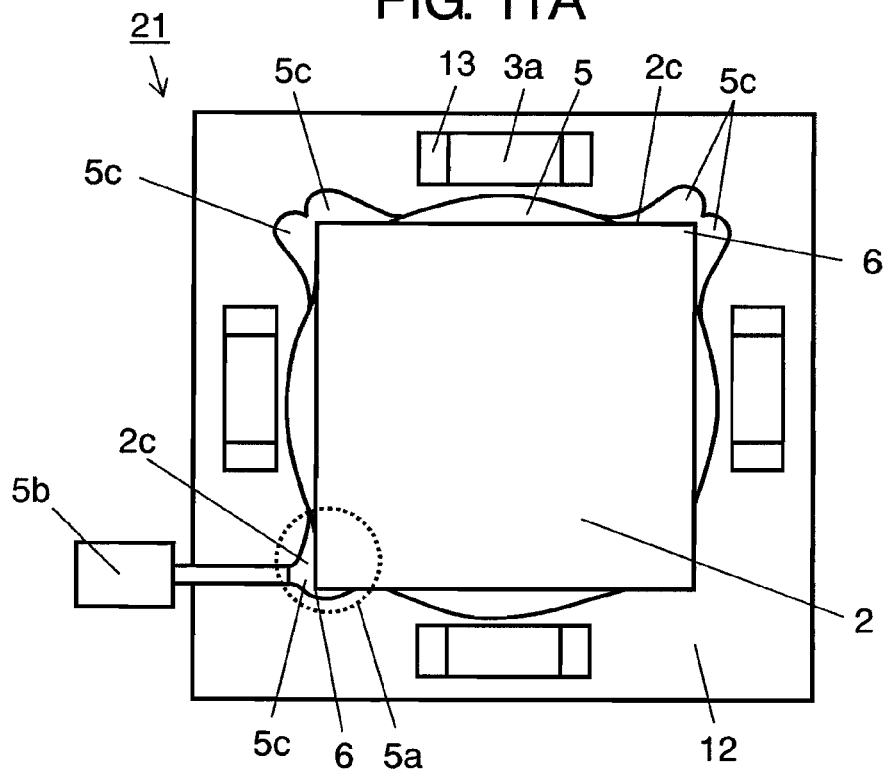
FIG. 11A shows a plan view of the semiconductor mounting substrate in a resin applying process according to the third embodiment of the present invention.
Figure 11B:
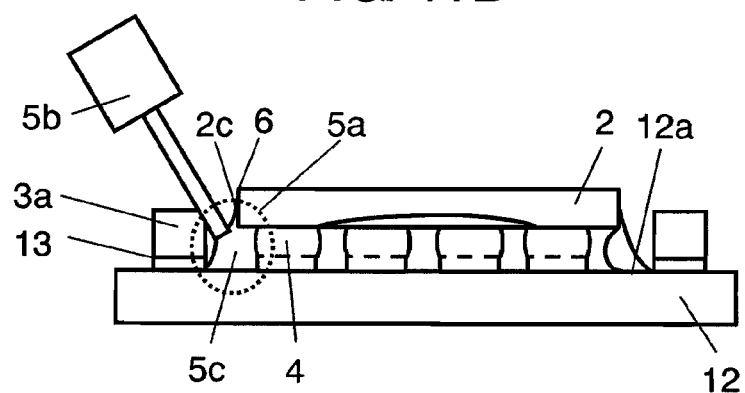
FIG. 11B shows a front view of the semiconductor mounting substrate in the resin applying process according to the third embodiment of the present invention.

FIG. 11A is a plan view of semiconductor mounting substrate 21 in resin applying process 47 in the present third embodiment. FIG. 11B is a front view of semiconductor mounting substrate 21 in resin applying process 47 in the same. In injection process 45, since an amount of first resin 5 to be injected is reduced for preventing the resin from adhering to chip component 3a adjacent to semiconductor device 2, first resin 5 is not applied to the side face in the vicinity of corner part 6 of semiconductor device 2, and a region is generated where side face 2c of semiconductor device 2 is exposed. Here, in this resin applying process 47, second resin 5c is applied by dispenser 5b to this exposed portion of semiconductor device 2. It is to be noted that in this resin applying process 47, second resin 5c is applied with substrate surface 12a where semiconductor device 2 is mounted turned upward. Thereby, second resin 5c flows in a direction to substrate 12, and then adheres to the exposed portion of side face 2c of semiconductor device 2 and substrate 12. It is to be noted that in the present third embodiment, second resin 5c is applied to two places with respect to each corner part 6, as shown in FIG. 11A.

Further, as second resin 5c in resin applying process 47, a resin is used whose viscosity is larger than the viscosity of first resin 5 in injection process 45. Therefore, in resin applying process 47, second resin 5c is less apt to flow than first resin 5 so that second resin 5c can be made resistant to adhering to chip component 3a. Here, the same resin is used as first resin 5 and second resin 5c, and the viscosities of those resins are made different by changing a temperature in application. In injection process 45 in the present third embodiment, for example, the temperature of first resin 5 in injection is set to about 60° C. Further, in resin applying process 47, the temperature of second resin 5*c* in application is set to a constant temperature.

Figure 12:
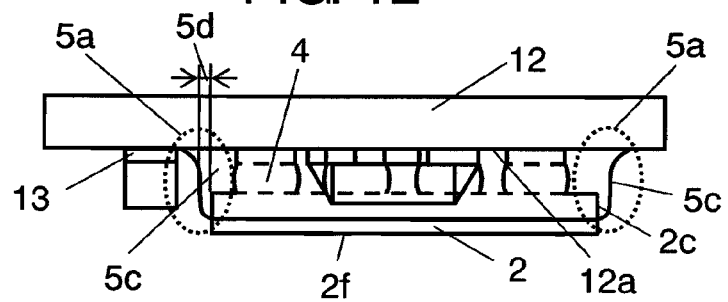
FIG. 12 shows a front view of the semiconductor mounting substrate in an inversion process according to the third embodiment of the present invention.
Figure 13:
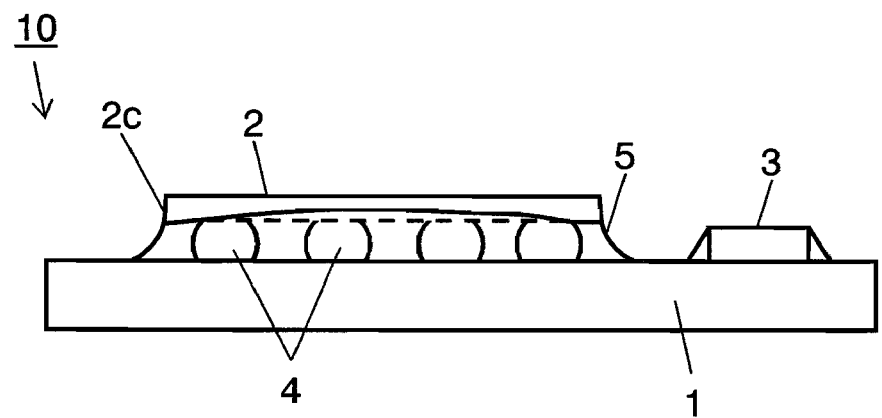
FIG. 13 shows a front view of a conventional semiconductor mounting substrate.
Figure 14:
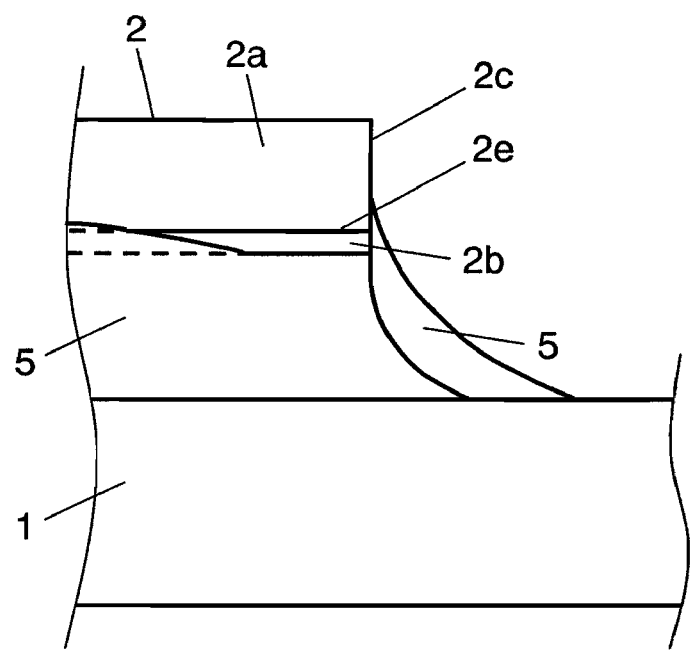
FIG. 14 shows an expanded front view of a main part of the conventional semiconductor mounting substrate.
Figure 15:
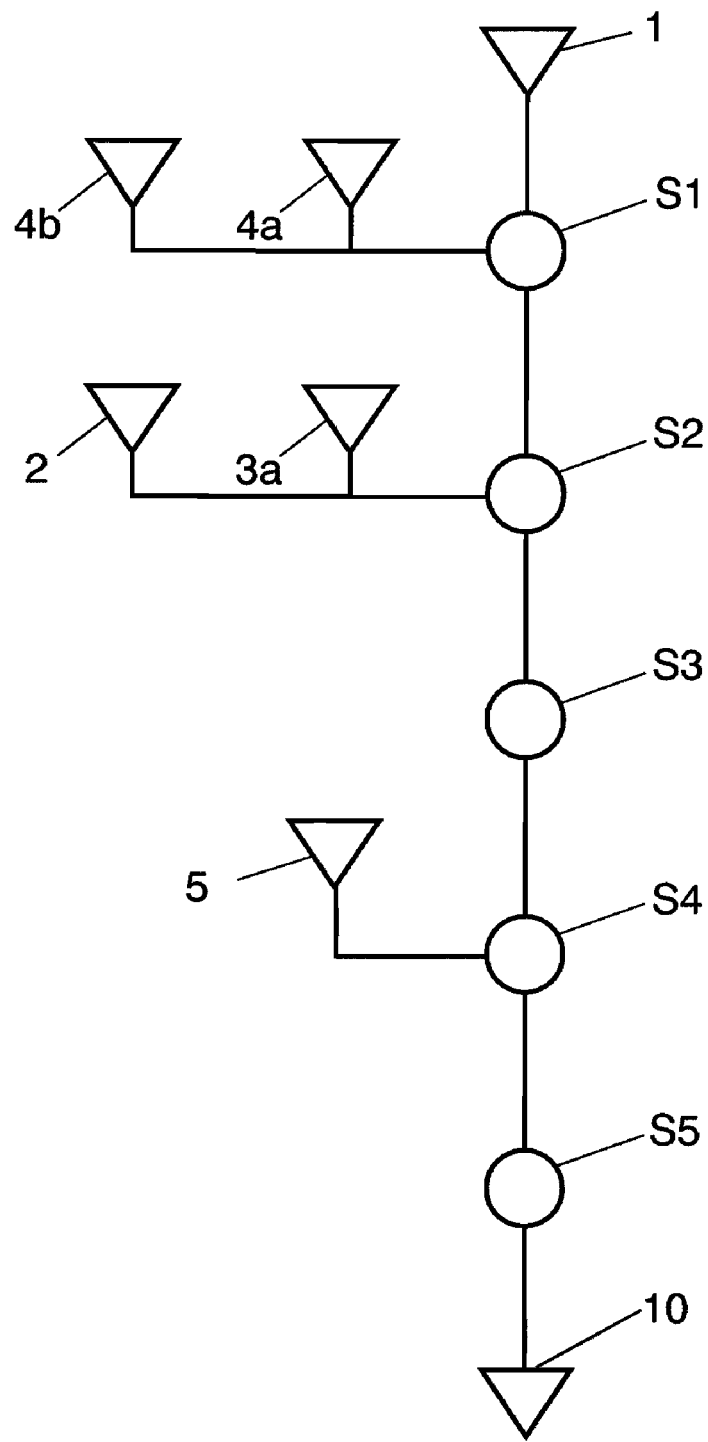
FIG. 15 shows a manufacturing flowchart for the conventional semiconductor mounting substrate.

Inversion process 48 after resin applying process 47 shown in FIG. 8 is a process of inverting substrate surface 12*a*, where semiconductor device 2 is mounted, to be turned downward. Then, as shown in FIG. 12, next hardening process 49 is performed while substrate surface 12*a* remains inverted as having done in inversion process 48. As thus described, in hardening process 49, heating is performed with substrate surface 12*a* where semiconductor device 2 is mounted turned downward. Therefore, due to a decrease in viscosity accompanied by an increase in temperature, second resin 5*c* extends to a region where first resin 5 has not been applied. Further, since second resin 5*c* comes to droop to head face 2*f* side on side face 2*c* of second resin 5*c*, thickness 5*d* of second resin 5*c* can be made large in the interface position (not shown) between the silicon substrate and the rewiring layer in semiconductor device 2. In this manner, bond strength enforcing resin section 5*a* at least including a thermosetting resin obtained by hardening second resin 5*c* is formed. Formation of this bond strength enforcing resin section 5*a* can further make cracking and the like hardly occur in this interface position. It is to be noted that in hardening process 49, hardening is performed at a temperature lower than the melting points of solder 13 and solder bumps 4.

Further, in FIGS. 7A and 7B, second resin 5*c* with the viscosity described above may be thermally hardened and included in bond strength enforcing resin section 5*a*, to form part of bond strength enforcing resin section 5*a*.

Subsequently, by hardening of second resin 5*c* in hardening process 49, filling of first resin 5 and second resin 5*c* between semiconductor device 2 and substrate 12 is completed, to complete semiconductor mounting substrate 21. In the present third embodiment, first resin 5 is hardened in hardening process 46 and second resin 5*c* is hardened in hardening process 49. This can prevent first resin 5 from coming into contact with chip component 3*a* during the inverting operation in inversion process 48. Therefore, it is possible to reliably provide space 14 between first resin 5 and chip component 3*a* or first resin 5 and solder 13.

It is to be noted that first resin 5 may be hardened in hardening process 49 in place of hardening process 46 concurrently with second resin 5*c*. This can reduce the number of heating to be applied to semiconductor device 2 and electronic components 3. Therefore, a change in characteristic of semiconductor device 2, chip components 3*a* or the like hardly occurs. Further, since first resin 5 is also hardened with substrate surface 12*a* where semiconductor device 2 is mounted turned downward, first resin 5 further flows to side face 2*c* side of semiconductor device 2. This can increase the thickness of first resin 5 in the vicinity of the interface between the silicon substrate and the rewiring layer, so that cracking hardly occurs in the vicinity of the interface.

Moreover, in the present third embodiment, first resin 5 was bonded to the height larger than the height of the interface between the silicon substrate and the rewiring layer in semiconductor device 2 so as to be resistant to dropping impact. However, when dropping-impact resistant strength is not much required, first resin 5 may be injected to a degree so as not to protrude from an outer shape of semiconductor device 2 in injection process 45, and second resin 5*c* may be applied to a region where first resin 5 is insufficient and has not been applied (e.g. the vicinity of corner part 6) in resin applying process 47. In this case, since an amount of first resin 5 protruding from semiconductor device 2 can be reduced, the distance between semiconductor device 2 and chip component 3*a* can be made even smaller. In this manner, mounting of semiconductor mounting substrate 21 can be performed with even higher density.

INDUSTRIAL APPLICABILITY

The semiconductor mounting substrate and the method for manufacturing the same according to the present invention have an effect of increasing dropping strength of a mounted semiconductor device and also reducing a gap between the mounted semiconductor device and electronic component, and are useful especially when applied to devices requiring large dropping strength and size reduction.

What is claimed is:

1. A method for manufacturing a semiconductor mounting substrate, comprising:
   supplying solder onto connection lands provided on a substrate;
   mounting a semiconductor device and electronic components on the connection lands on the substrate, the semiconductor device having a silicon substrate and a resin layer provided on a face of the silicon substrate;
   heating the semiconductor device and the electronic components on the substrate so as to connect the semiconductor device and the electronic components onto the connection lands on the substrate by reflowing the solder;
   filling a first resin by injection into a space between the semiconductor device and the substrate from a central part of a side face of the semiconductor device; and
   hardening the first resin, wherein,
   after injection and filling of the first resin into at least the space, the first resin forms a bond strength reinforcing resin section between a side face in the vicinity of a corner part of the semiconductor device and a surface of the substrate in a position corresponding to the corner part, wherein the first resin of the bond strength reinforcing resin section covers an interface between the silicon substrate and the resin layer of the semiconductor device.

2. The method for manufacturing a semiconductor mounting substrate according to claim 1, wherein
   in said mounting of the semiconductor device and the electronic components, the semiconductor device and an electronic component are mounted with a prescribed spacing held therebetween so as to form a space, where the first resin can creep up, between the corner part of the semiconductor device and the electronic component, and
   in said filling of the first resin, the first resin is made to creep up in the space between the side face of the semiconductor device and the side face of the electronic component, to form the bond strength reinforcing resin section.

3. The method for manufacturing a semiconductor mounting substrate according to claim 2, wherein in said mounting of the semiconductor device and the electronic component, the electronic component is located in the vicinity of the corner part of the semiconductor device and in a position displaced in a direction away from the semiconductor device, from positions of the connection lands where the electronic component should be mounted, the electronic component is mounted in a position where the electronic component can be in contact with cream solder, and the electronic component is brought closer to the corner part side of the semiconductor device and then heated.

4. The method for manufacturing a semiconductor mounting substrate according to claim 1, further comprising:
applying a second resin to the vicinity of the corner part of the semiconductor device after said filling of the first resin, wherein
the first resin and the second resin are made of a thermosetting resin,
a viscosity of the second resin in said applying of the second resin is larger than a viscosity of the first resin in said filling of the first resin, and
the bond strength reinforcing resin section at least includes a thermosetting resin obtained by hardening the second resin.

5. The method for manufacturing a semiconductor mounting substrate according to claim 4, wherein the second resin is hardened with the substrate surface where the semiconductor device is mounted turned downward.

6. The method for manufacturing a semiconductor mounting substrate according to claim 4, wherein a temperature of the second resin in said applying of the second resin is lower than a temperature of the first resin in said filling of the first resin.

7. The method for manufacturing a semiconductor mounting substrate according to claim 6, wherein the first resin and the second resin are made of the same resin.

8. The method for manufacturing a semiconductor mounting substrate according to claim 4, wherein the first resin is hardened prior to said applying of the second resin.

9. The method for manufacturing a semiconductor mounting substrate according to claim 8, wherein the first resin is hardened with the substrate surface where the semiconductor device is mounted turned downward.

10. The method for manufacturing a semiconductor mounting substrate according to claim 4, wherein the first resin is hardened concurrently with the second resin.

11. The method for manufacturing a semiconductor mounting substrate according to claim 4, wherein in said filling of the first resin, the first resin is filled so as to provide a space between the first resin having flown out from the space between the semiconductor device and the substrate and solder formed on the electronic component.

12. The method for manufacturing a semiconductor mounting substrate according to claim 4, wherein
the first resin is hardened prior to said applying of the second resin, and is hardened with the substrate surface where the semiconductor device is mounted turned downward, and
in said applying of the second resin, the second resin is applied to an exposed portion of the side face of the semiconductor device.

* * * * *